(12) United States Patent
Kubota

(10) Patent No.: US 12,107,382 B2
(45) Date of Patent: Oct. 1, 2024

(54) ARRAY DEVICE MANUFACTURING METHOD, MANUFACTURING APPARATUS, AND STORAGE MEDIUM

(71) Applicant: SUMITOMO ELECTRIC INDUSTRIES, LTD., Osaka (JP)

(72) Inventor: Ryosuke Kubota, Osaka (JP)

(73) Assignee: SUMITOMO ELECTRIC INDUSTRIES, LTD., Osaka (JP)

(*) Notice: Subject to any disclaimer, the term of this patent is extended or adjusted under 35 U.S.C. 154(b) by 561 days.

(21) Appl. No.: 17/493,348

(22) Filed: Oct. 4, 2021

(65) Prior Publication Data

US 2022/0115833 A1  Apr. 14, 2022

(30) Foreign Application Priority Data

Oct. 8, 2020 (JP) ................. 2020-170765

(51) Int. Cl.
*H01S 5/02* (2006.01)
*H01S 5/00* (2006.01)
*H01S 5/183* (2006.01)

(52) U.S. Cl.
CPC .......... *H01S 5/0201* (2013.01); *H01S 5/0042* (2013.01); *H01S 5/183* (2013.01)

(58) Field of Classification Search
CPC ....... H01S 5/0201; H01S 5/0042; H01S 5/183
See application file for complete search history.

(56) References Cited

U.S. PATENT DOCUMENTS

| 5,872,386 A | 2/1999 | Sato et al. |
| 2012/0149141 A1* | 6/2012 | Behfar .................... H01S 5/185 438/46 |

FOREIGN PATENT DOCUMENTS

| CN | 102354699 A | 2/2012 |
| CN | 111261539 A | 6/2020 |
| JP | H09092870 A | 4/1997 |
| JP | 2010-232502 A | 10/2010 |

* cited by examiner

*Primary Examiner* — Yuanda Zhang
(74) *Attorney, Agent, or Firm* — Volpe Koenig

(57) ABSTRACT

An array device manufacturing method includes the steps of forming a plurality of optical elements on a wafer; inspecting the plurality of optical elements; defining dicing lines on the basis of a result of the inspection such that an array device composed entirely of one or more non-defective ones of the plurality of optical elements is obtained, the one or more non-defective ones being determined to be non-defective in the inspection; and forming the array device by dicing the wafer along the dicing lines.

9 Claims, 6 Drawing Sheets

ARRAY DEVICE MANUFACTURING METHOD, MANUFACTURING APPARATUS, AND STORAGE MEDIUM

CROSS REFERENCES TO RELATED APPLICATIONS

This application claims priority based on Japanese Patent Application No. 2020-170765, filed on Oct. 8, 2020, and the entire contents of the Japanese patent application are incorporated herein by reference.

BACKGROUND OF THE INVENTION

1. Field of the Invention

The present disclosure relates to an array device manufacturing method, a manufacturing apparatus, and a storage medium.

2. Description of the Related Art

Techniques for producing a plurality of optical elements, such as surface emitting lasers, on a wafer have been known. The wafer having the optical elements (e.g., vertical cavity surface emitting lasers (VCSELs)) formed thereon is divided into a plurality of array devices, each including optical elements (see, e.g., Japanese Unexamined Patent Application Publication No. 2010-232502).

SUMMARY OF THE INVENTION

If at least one of optical elements in an array device is defective, the entire array device is deemed to be defective and this contributes to reduced yields. Accordingly, an object of the present disclosure is to provide an array device manufacturing method, a manufacturing apparatus, a manufacturing program that can achieve improved yields.

An array device manufacturing method according to an embodiment of the present disclosure includes the steps of forming a plurality of optical elements on a wafer; inspecting the plurality of optical elements; defining dicing lines on the basis of a result of the inspection such that an array device composed entirely of one or more non-defective ones of the plurality of optical elements is obtained, the one or more non-defective ones being determined to be non-defective in the inspection; and forming the array device by dicing the wafer along the dicing lines.

An array device manufacturing apparatus according to an embodiment of the present disclosure includes an inspection unit configured to inspect a plurality of optical elements formed on a wafer; and a dicing machine configured to form an array device by dicing the wafer along dicing lines defined such that the array device is composed entirely of one or more non-defective ones of the plurality of optical elements, the one or more non-defective ones being determined to be non-defective in the inspection.

A storage medium for manufacturing an array device according to an embodiment of the present disclosure stores a program causing a computer to execute the processes of inspecting a plurality of optical elements formed on a wafer; defining dicing lines on the basis of a result of the inspection such that an array device composed entirely of one or more non-defective ones of the plurality of optical elements is obtained, the one or more non-defective ones being determined to be non-defective in the inspection; and forming the array device by dicing the wafer along the dicing lines.

DESCRIPTION OF THE PREFERRED EMBODIMENTS

Figure 1A:
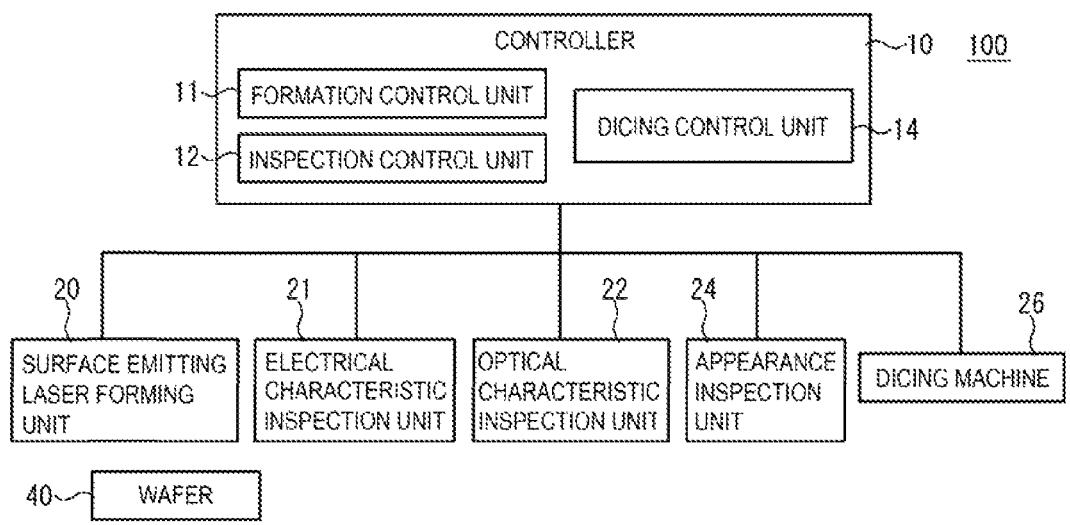
FIG. 1A is a block diagram illustrating a manufacturing apparatus.

[Summary of Embodiments of the Present Disclosure]

Embodiments of the present disclosure are summarized below.

An aspect of the present disclosure is (1) an array device manufacturing method including the steps of forming a plurality of optical elements on a wafer; inspecting the plurality of optical elements; defining dicing lines on the basis of a result of the inspection such that an array device composed entirely of one or more non-defective ones of the plurality of optical elements is obtained, the one or more non-defective ones being determined to be non-defective in the inspection; and forming the array device by dicing the wafer along the dicing lines. The dicing lines are defined such that the array device is composed entirely of one or more optical elements determined to be non-defective in the inspection. The array device includes only non-defective optical elements and does not include any defective optical elements. Improved yields can thus be achieved.

(2) The step of forming the array device may be a step of forming a plurality of array devices of different sizes. The dicing lines are defined in accordance with the positions and the number of defective optical elements, in such a way that the defective optical elements are excluded. Non-defective array devices are thus obtained, and improved yields are achieved.

(3) The step of defining dicing lines may be a step of defining the dicing lines such that assigning a first array device including more optical elements to a section of the wafer is prioritized over assigning a second array device including less optical elements to a section of the wafer. The size of the array device can be changed in accordance with the positions and the number of defective optical elements. Non-defective array devices are thus obtained, and improved yields are achieved.

(4) The first array device may include four or more optical elements. The size of the array device can be changed in accordance with the positions and the number of defective optical elements. Non-defective array devices are thus obtained, and improved yields are achieved.

(5) The step of forming a plurality of optical elements may be a step of forming a plurality of surface emitting lasers or light receiving elements made of a compound semiconductor. Since the optical elements emit or receive light in the plane of the wafer, the inspection can be carried out before dicing.

(6) The step of inspecting may be a step of inspecting with respect to a plurality of items, and the step of defining dicing lines may be a step of defining the dicing lines such that the array device is composed entirely of one or more non-defective ones of the plurality of optical elements, the one or more non-defective ones being determined to be non-defective in all the plurality of items. The array device includes only optical elements determined to be non-defective in the inspection with respect to all the items. Improved yields can thus be achieved.

(7) The step of inspecting may be a step of checking at least one of an appearance, an electrical characteristic, and an optical characteristic of the optical elements. The array device includes only optical elements determined to be non-defective in the inspection with respect to all the items. Improved yields can thus be achieved.

(8) The step of forming the array device may include a step of dicing the wafer with laser. The wafer can thus be cut by laser dicing along the dicing lines to form the array device.

Another aspect of the present disclosure is (9) an array device manufacturing apparatus including an inspection unit configured to inspect a plurality of optical elements formed on a wafer; and a dicing machine configured to form an array device by dicing the wafer along dicing lines defined such that the array device is composed entirely of one or more non-defective ones of the plurality of optical elements, the one or more non-defective ones being determined to be non-defective in the inspection. The dicing lines are defined such that the array device is composed entirely of one or more optical elements determined to be non-defective in the inspection. The array device includes only non-defective optical elements and does not include any defective optical elements. Improved yields can thus be achieved.

Another aspect of the present disclosure is (10) a storage medium storing a program for manufacturing an array device. The program causes a computer to execute the processes of inspecting a plurality of optical elements formed on a wafer; defining dicing lines on the basis of a result of the inspection such that an array device composed entirely of one or more non-defective ones of the plurality of optical elements is obtained, the one or more non-defective ones being determined to be non-defective in the inspection; and forming the array device by dicing the wafer along the dicing lines. The array device includes only non-defective optical elements and does not include any defective optical elements. Improved yields can thus be achieved.

[Details of Embodiments of the Present Disclosure]

Examples of an array device manufacturing method, a manufacturing apparatus, and a storage medium according to embodiments of the present disclosure will now be described with reference to the drawings. Note that the present disclosure is not limited to the embodiments described herein and is defined by the appended claims. All changes that fall within meanings and scopes equivalent to the claims are intended to be embraced by the claims.

(Manufacturing Apparatus)

FIG. 1A is a block diagram illustrating a manufacturing apparatus 100. As illustrated in FIG. 1A, the manufacturing apparatus 100 includes a controller 10, a surface emitting laser forming unit 20, an electrical characteristic inspection unit 21, an optical characteristic inspection unit 22, an appearance inspection unit 24, and a dicing machine 26. The manufacturing apparatus 100 manufactures array devices from a wafer 40.

The surface emitting laser forming unit 20 forms surface emitting lasers on the wafer 40. The surface emitting laser forming unit 20 includes devices used in processes, such as metal organic chemical vapor deposition (MOCVD), evaporation, etching, and chemical vapor deposition (CVD).

The electrical characteristic inspection unit 21 includes, for example, a current/voltage source. The electrical characteristic inspection unit 21 checks the electrical characteristics, such as differential resistance, of surface emitting lasers. The optical characteristic inspection unit 22 includes, for example, a light receiving element and a spectrometer. The optical characteristic inspection unit 22 measures, for example, emission intensity and spectrum to check optical characteristics. The appearance inspection unit 24 includes, for example, a camera. The appearance inspection unit 24 checks the appearance of surface emitting lasers formed on the wafer 40. The dicing machine 26 includes, for example, a laser light source and a blade. The dicing machine 26 performs laser dicing and blade dicing to divide the wafer 40 along dicing lines.

Figure 1B:
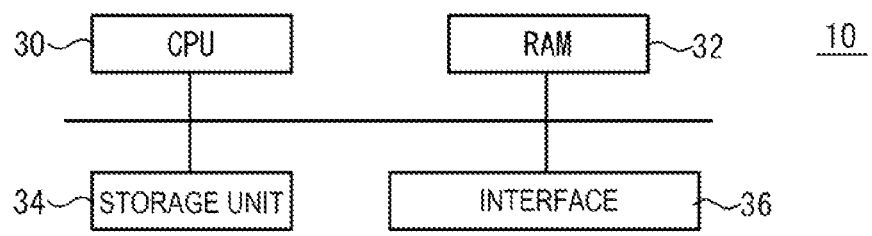
FIG. 1B is a block diagram illustrating a hardware configuration of a controller.

FIG. 1B is a block diagram illustrating a hardware configuration of the controller 10. As illustrated in FIG. 1B, the controller 10 includes a central processing unit (CPU) 30, a random-access memory (RAM) 32, a storage unit (storage medium) 34, and an interface 36. The CPU 30, the RAM 32, the storage unit 34, and the interface 36 are connected to one another, for example, by a bus. The RAM 32 is a volatile memory that temporarily stores programs and data. The storage unit 34 is, for example, a read-only memory (ROM), a solid-state drive (SSD) such as a flash memory, or a hard disc drive (HDD). The storage unit 34 stores, for example, a measurement program (described below).

The CPU 30 executes programs stored in the RAM 32 to implement, for example, a formation control unit 11, an inspection control unit 12, and a dicing control unit 14 (see FIG. 1A) in the controller 10. Each unit of the controller 10 may be a hardware component, such as a circuit. The formation control unit 11 controls the surface emitting laser forming unit 20 to form surface emitting lasers on the wafer 40. The inspection control unit 12 acquires inspection data from the electrical characteristic inspection unit 21, the optical characteristic inspection unit 22, and the appearance inspection unit 24 to determine the quality of surface emitting lasers. Alternatively, the electrical characteristic inspection unit 21, the optical characteristic inspection unit 22, and the appearance inspection unit 24 may individually determine the quality of surface emitting lasers and send the results to the inspection control unit 12. The dicing control unit 14 defines dicing lines on the basis of the results of the determination, and causes the dicing machine 26 to perform dicing on the basis of the dicing lines.

Figure 2A:
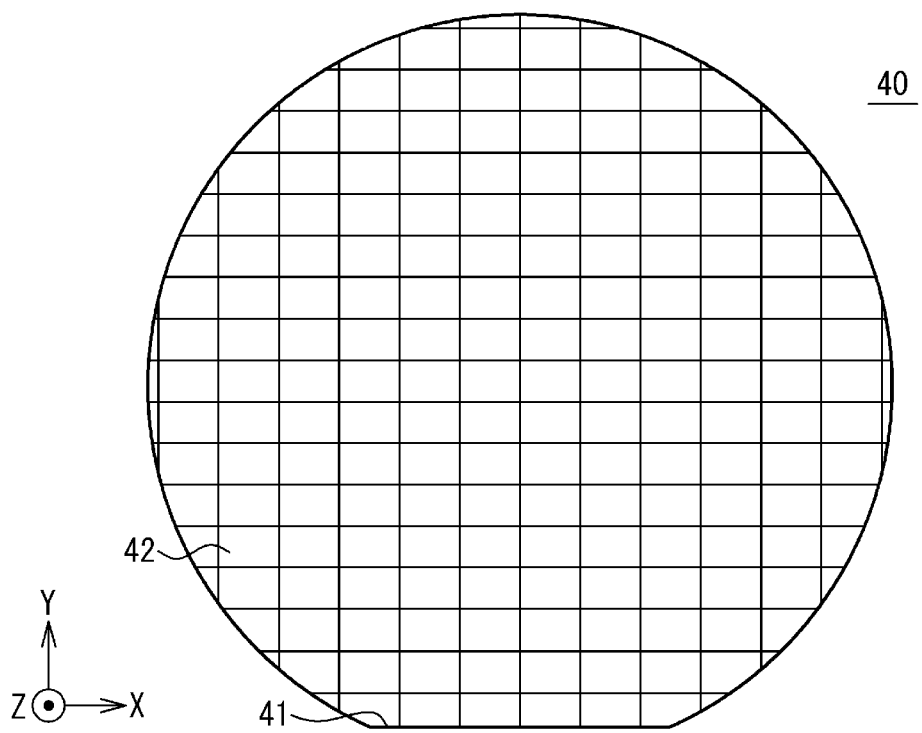
FIG. 2A is a plan view illustrating a wafer.

FIG. 2A is a plan view illustrating the wafer 40. The wafer 40 has, for example, several tens of thousands of surface emitting lasers 42. The wafer 40 extends in the XY plane. The surface emitting lasers 42 are arranged in a two-dimensional grid in the X-axis direction and the Y-axis direction. The Z-axis direction is a direction in which the surface emitting lasers 42 emit light. The X-axis direction, the Y-axis direction, and the Z-axis direction are orthogonal to one another. An orientation flat 41 extends in the X-axis direction.

The surface emitting lasers 42 are formed of a compound semiconductor of, for example, indium phosphide (InP), gallium arsenide (GaAs), and indium gallium arsenide phosphide (InGaAsP). The surface emitting lasers 42 have a multilayer structure of a lower cladding layer, a core layer, and an upper cladding layer. For example, the lower cladding layer is formed of n-type aluminum gallium arsenide (AlGaAs), and the upper cladding layer is formed of p-type AlGaAs. An active layer is formed of, for example, indium gallium arsenide (InGaAs) and has a multi-quantum well (MQW) structure.

Figure 2B:
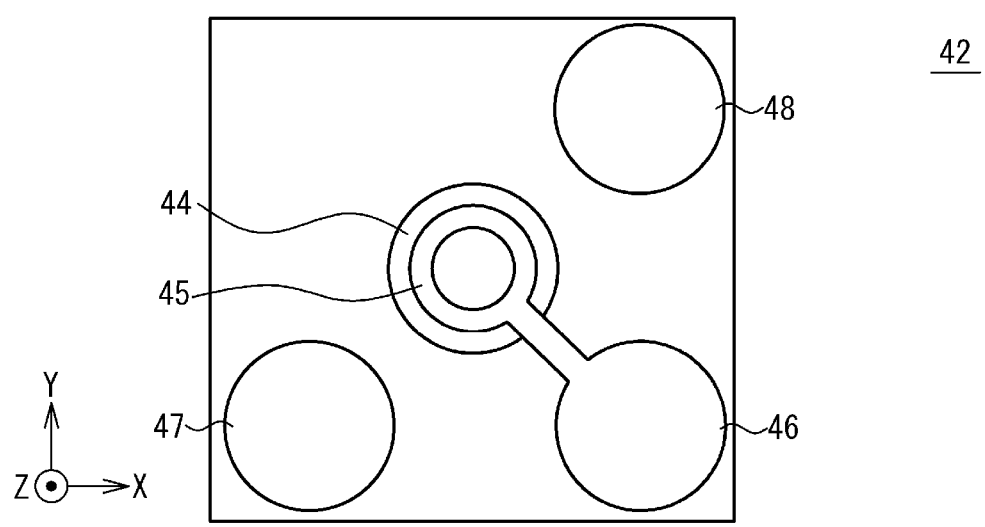
FIG. 2B is a plan view illustrating a surface emitting laser.

FIG. 2B is a plan view illustrating one of the surface emitting lasers 42. As illustrated in FIG. 2B, the surface emitting laser 42 has a mesa 44 and pads 46 to 48. The mesa 44 is located substantially in the center of the surface emitting laser 42. The pads 46 to 48 are located near the top of the surface emitting laser 42. The pads 46 and 47 are arranged in the X-axis direction, and the pads 46 and 48 are arranged in the Y-axis direction. The pad 47, the mesa 44, and the pad 48 are arranged along a diagonal of the surface emitting laser 42.

The mesa 44 includes the lower cladding layer, the core layer, and the upper cladding layer and functions as a light emitting portion. An electrode 45 is disposed on the mesa 44 and electrically connected to the p-type upper cladding layer and the pad 46. The pads 47 and 48 are electrically connected to an n-type electrode (not shown) and the n-type lower cladding layer. The pads 46 to 48 are formed of a metal, such as gold (Au). The electrode 45 is a multilayer body of, for example, titanium, platinum, and gold (Ti/Pt/Au). The n-type electrode is formed of, for example, a gold-germanium alloy (Au—Ge alloy).

The surface emitting laser 42 is driven by using one of the two n-type pads 47 and 48. That is, by applying a voltage to the pad 46 and one of the pads 47 and 48, carriers are injected into the core layer of the mesa 44. The carrier injection enables the surface emitting laser 42 to emit light with a wavelength of, for example, 800 nm to 1000 nm in the Z-axis direction.

An array device including the surface emitting laser 42 is produced from the wafer 40 illustrated in FIG. 2A. The array device in the present embodiment refers to a device including one or more surface emitting lasers 42.

Figure 3:
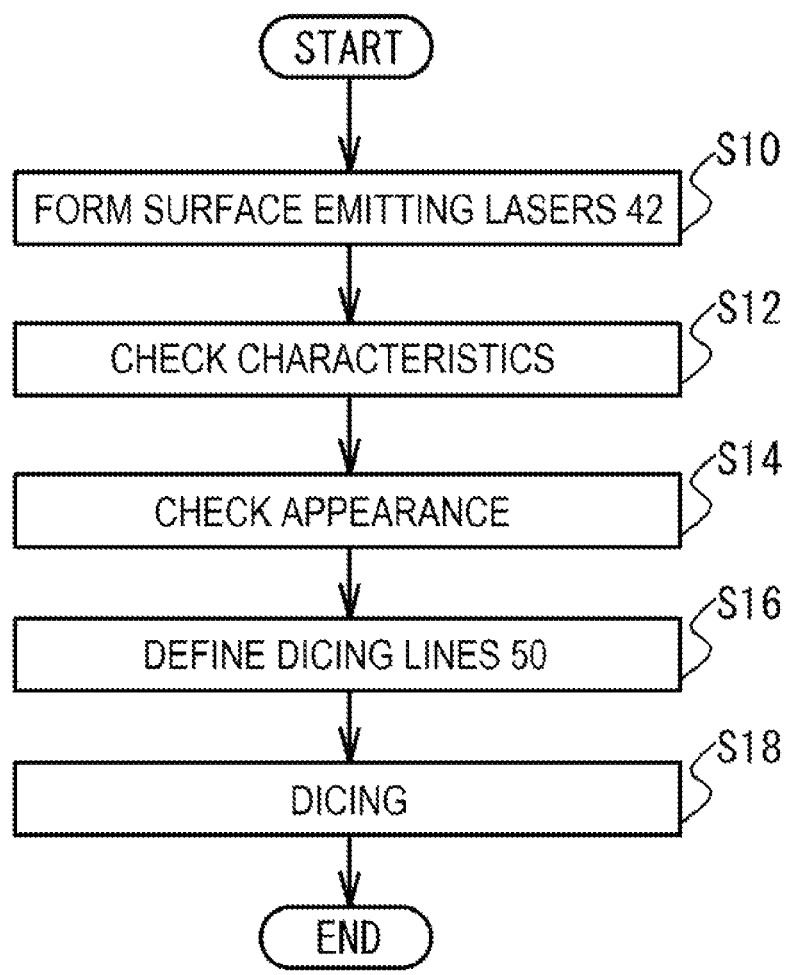
FIG. 3 is a flowchart illustrating an array device manufacturing method.

FIG. 3 is a flowchart illustrating an array device manufacturing method. First, a plurality of surface emitting lasers 42 are formed on the wafer 40 by the surface emitting laser forming unit 20 illustrated in FIG. 1A (step S10). Specifically, a lower cladding layer, a core layer, and an upper cladding layer are epitaxially grown on the wafer 40, for example, by MOCVD. The mesa 44 illustrated in FIG. 2B is formed, for example, by etching. To electrically separate the surface emitting lasers 42 in the wafer 40, grooves are formed, for example, by etching in a conductive semiconductor layer. The wafer 40 has an insulating protective film on the surface thereof. The insulating protective film is, for example, a silicon nitride (SiN) film, a silicon oxynitride (SiON) film, or a silicon oxide ($SiO_2$) film formed, for example, by CVD. The electrode 45 and the pads 46 to 48 are formed, for example, by resist patterning and evaporation.

The electrical characteristic inspection unit 21 and the optical characteristic inspection unit 22 check the characteristics of the surface emitting lasers 42 (step S12). The electrical characteristic inspection unit 21 measures, for example, differential resistance. The optical characteristic inspection unit 22 measures, for example, light intensity, emission wavelength, and spectrum. The appearance inspection unit 24 checks the appearance of the surface emitting lasers 42 (step S14). The characteristics and appearances of either all or only some of the surface emitting lasers 42 in the wafer 40 may be checked.

The controller 10 acquires the results of the checking from the electrical characteristic inspection unit 21, the optical characteristic inspection unit 22, and the appearance inspection unit 24 and identifies non-defectives and defectives in the wafer 40. The dicing control unit 14 defines dicing lines 50 on the basis of the positions of the non-defectives and defectives (step S16). The dicing lines 50 are, for example, 50 μm wide. A semiconductor layer is exposed in the dicing lines 50. The dicing machine 26 performs dicing along the dicing lines 50 to form array devices (step S18). The process illustrated in FIG. 3 ends here.

Figure 4A:
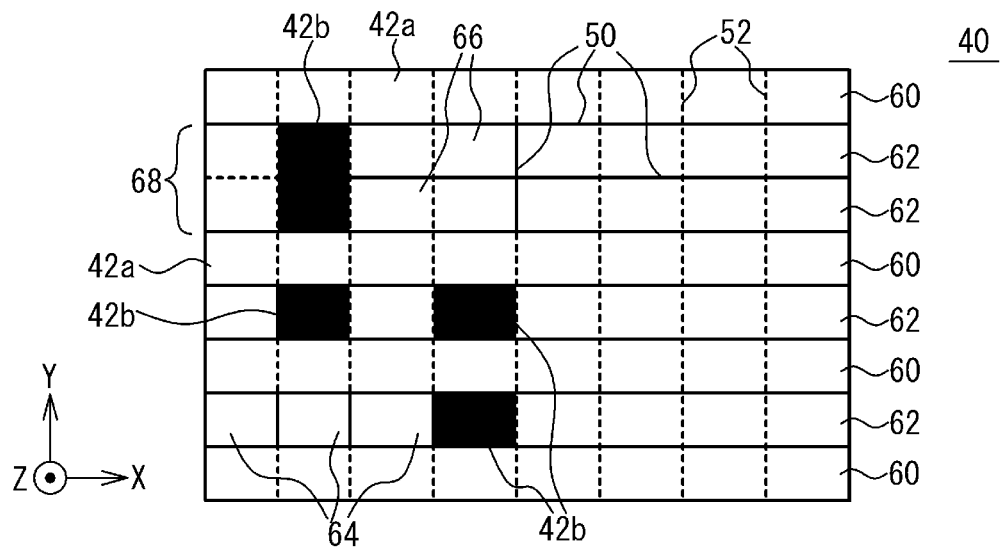
FIG. 4A is an enlarged plan view of part of the wafer.
Figure 4B:
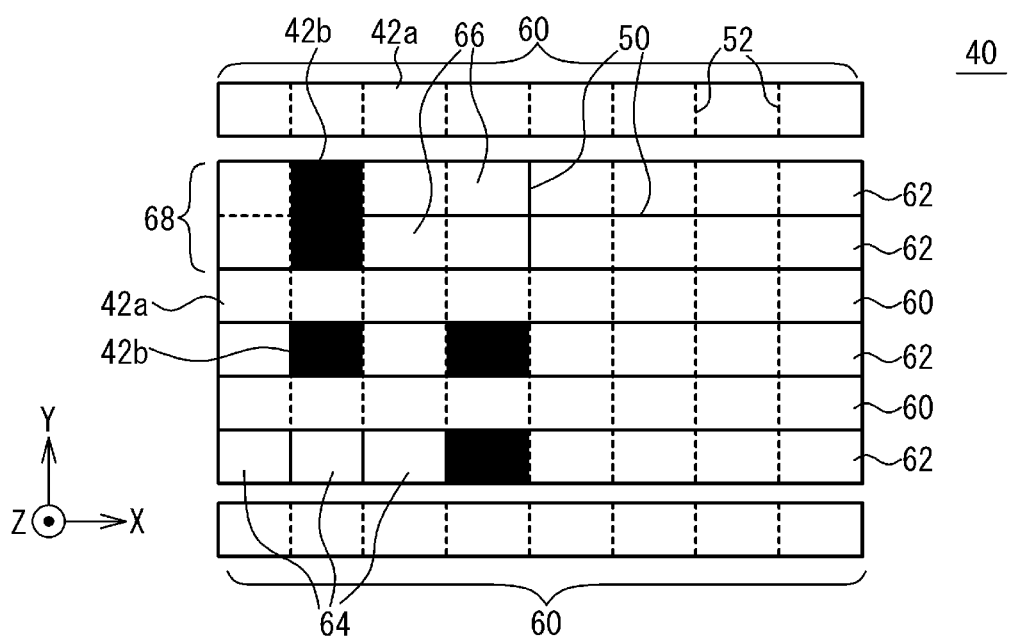
FIG. 4B is another enlarged plan view of part of the wafer.
Figure 5:
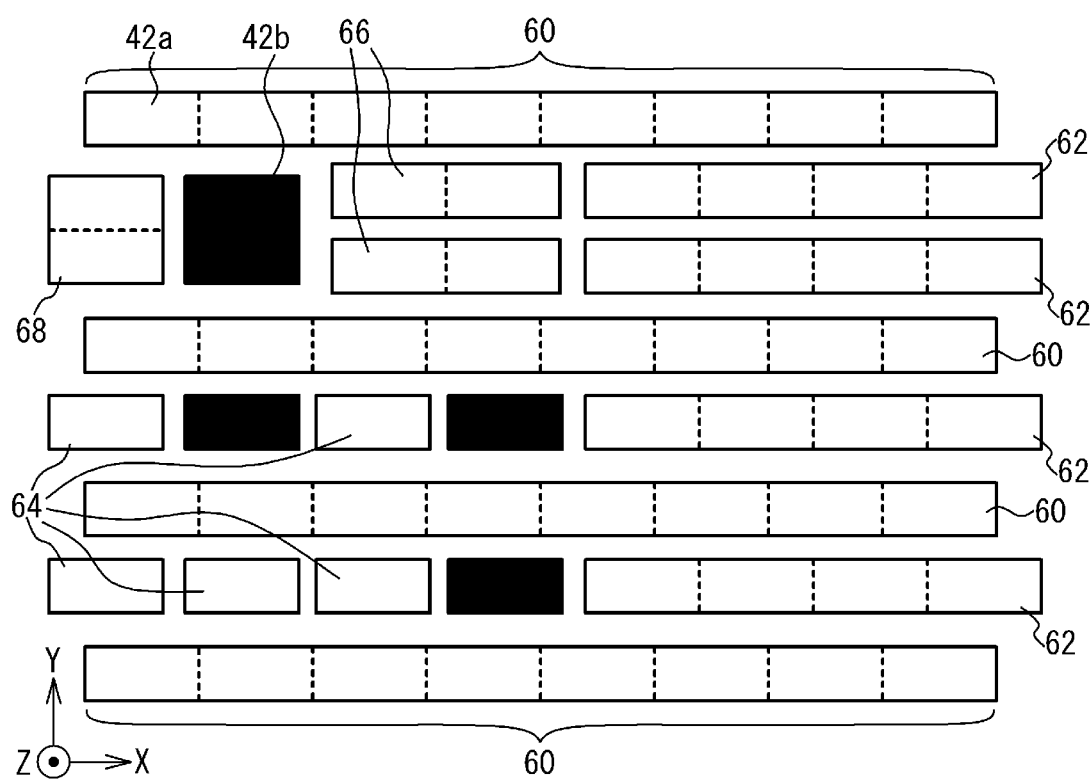
FIG. 5 is another enlarged plan view of part of the wafer.

FIGS. 4A to 5 each are an enlarged plan view of part of the wafer 40 and illustrate an example of dicing. The dicing process proceeds in order from FIG. 4A to FIG. 5. Surface emitting lasers 42a are those determined to be non-defective in the inspection, whereas surface emitting lasers 42b indicated in black in FIG. 4A to FIG. 5 are those determined to be defective. Solid lines each indicate a dicing line 50. Dotted lines each indicate a boundary 52 between adjacent ones of the plurality of surface emitting lasers 42. The dicing lines 50 and the boundaries 52 extend in a grid. The dicing lines 50 each coincide with any of the boundaries 52.

As illustrated in FIG. 5, a plurality of different types of array devices 60, 62, 64, 66, and 68 are produced from the wafer 40. The array devices 60, 62, 64, 66, and 68 differ in the number and arrangement of the surface emitting lasers 42 therein. An array device may be referred to as a B×A device, where A is the number of surface emitting lasers 42 arranged therein in the X-axis direction, and B is the number of surface emitting lasers 42 arranged therein in the Y-axis direction. This means that the array device 60 is a 1×8 device, the array device 62 is a 1×4 device, the array device 64 is a 1×1 device, the array device 66 is a 1×2 device, and the array device 68 is a 2×1 device.

As indicated by solid lines in FIG. 4A, the dicing control unit 14 defines the dicing lines 50 such that each array device does not include any defective surface emitting lasers 42b and is composed entirely of one or more non-defective surface emitting lasers 42a (step S16 in FIG. 3). For example, the dicing control unit 14 assigns the array devices 60, the array devices 62, and the array devices 64 to appropriate sections of the wafer 40 in order of priority, and assigns the array devices 66 and 68 to the remaining sections of the wafer 40.

The dicing control unit 14 assigns the array devices 60 to respective sections of the wafer 40 in order from the lower left in FIG. 4A. When eight non-defective surface emitting lasers 42a are arranged as in the bottom row in FIG. 4A, the 1×8 array device 60 can be assigned to the corresponding section. However, the array device 60 cannot be assigned to a section including any defective surface emitting laser 42b, as in the second row from the bottom in FIG. 4A. The dicing control unit 14 assigns the 1×4 array device 62 to a section where four non-defective surface emitting lasers 42a are arranged, and further assigns three 1×1 array devices 64 to respective sections. The dicing control unit 14 also assigns the other array devices to the remaining sections of the wafer 40. For example, the dicing control unit 14 assigns the 1×4 array device 62 and the 1×2 array device 66 to a section where six non-defective surface emitting lasers 42a are arranged.

As illustrated in FIG. 4B, the dicing machine 26 performs dicing along the dicing lines 50 to separate the array devices 60 from the rest of the wafer 40. When the wafer 40 is cut in the X-axis direction as in FIG. 4B, the dicing machine 26 may perform dicing either with a blade or laser.

As illustrated in FIG. 5, the dicing machine 26 further performs dicing to form the array devices 60, 62, 64, 66, and 68. When the wafer 40 is cut both in the X-axis direction and the Y-axis direction as illustrated in FIG. 5, it is preferable to use laser dicing which can be directionally controlled easily. Four array devices 60, four array devices 62, two array devices 66, five array devices 64, and one array device 68 are thus produced.

COMPARATIVE EXAMPLE

Figure 6A:
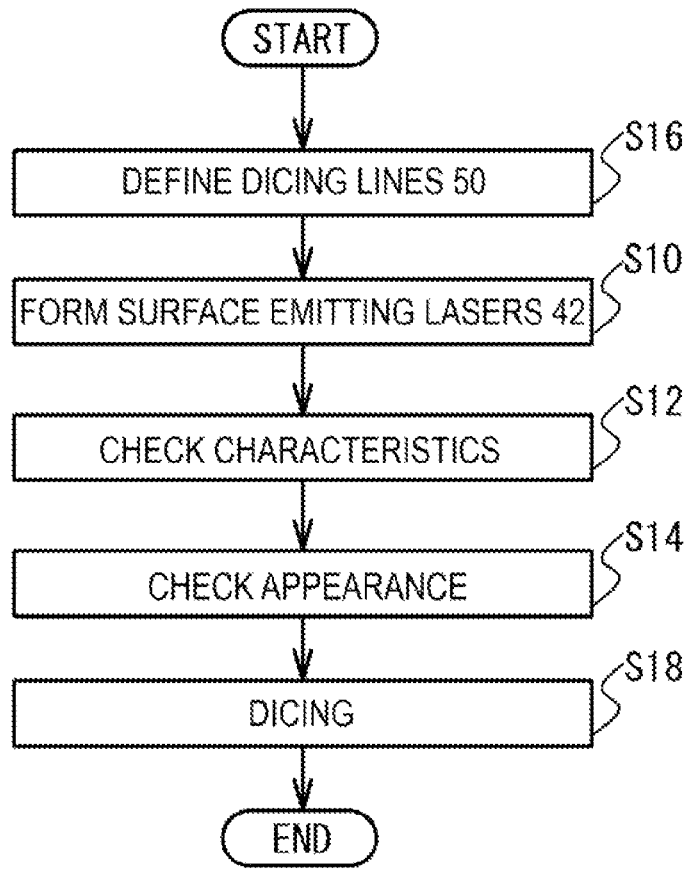
FIG. 6A is a flowchart illustrating a manufacturing method according to a comparative example.

In a comparative example, the dicing lines 50 are defined before inspection, and only array devices of the same shape are produced from the wafer 40. FIG. 6A is a flowchart illustrating a manufacturing method according to the comparative example. As illustrated in FIG. 6A, first, the dicing lines 50 are defined (step S16). For example, the dicing lines 50 are defined such that only the 1×8 array devices 60 are produced. The surface emitting lasers 42 are formed on the wafer 40 (step S10) and their characteristics and appearances are checked (steps S12 and S14). Then, dicing is performed along the dicing lines 50 to form a plurality of array devices 60 (step S18).

Figure 6B:
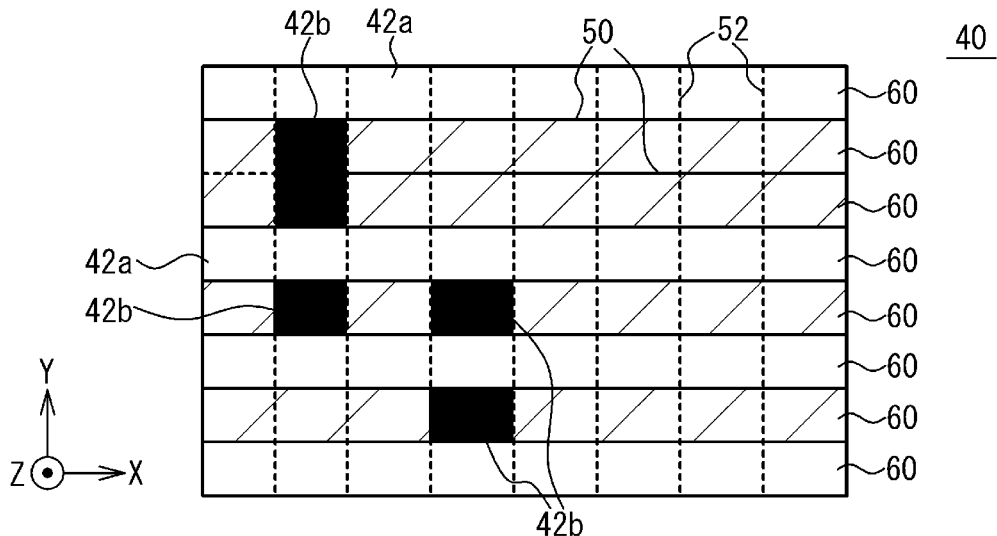
FIG. 6B is an enlarged plan view of the wafer.

FIG. 6B is an enlarged plan view of the wafer 40. If the array device 60 includes any defective surface emitting laser 42b, the array device 60 is deemed to be defective. Although four array devices 60 are produced in the example illustrated in FIG. 6B, the other four array devices 60 indicated with diagonal lines are defective. This contributes to reduced yields.

In the present embodiment, a plurality of surface emitting lasers 42 are inspected before dicing of the wafer 40. The dicing control unit 14 defines the dicing lines 50 such that the array devices each are composed entirely of one or more surface emitting lasers 42a determined to be non-defective in the inspection. As illustrated in FIG. 5, the array devices each are composed entirely of one or more non-defective surface emitting lasers 42a and does not include any defective surface emitting lasers 42b. This improves yields of the array devices.

As in the example illustrated in FIG. 4A to FIG. 5, a plurality of different types of array devices having different sizes may be formed in accordance with the positions and the number of the defective surface emitting lasers 42b, in such a way that the defective surface emitting lasers 42b are excluded. Non-defective array devices are thus obtained, and improved yields are achieved. When assigning an array device to a section of the wafer 40, the dicing control unit 14 prioritizes an array device including more surface emitting lasers 42 over an array device including less surface emitting lasers 42. For example, an array device including more surface emitting lasers 42 is assigned to an area with less defectives in the wafer 40, whereas an array device including less surface emitting lasers 42 is assigned to an area with more defectives in the wafer 40.

As illustrated in FIG. 4A to FIG. 5, for example, an array device including a plurality of (e.g., four, six, or eight) surface emitting lasers 42 is acquired from an area with less defectives in the wafer 40, whereas the array device 64 including one surface emitting laser 42 is acquired from an area with more defectives in the wafer 40. This reduces the possibility that the array device will be defective, and thus improves yields. The array device may include four or more surface emitting lasers 42, or may include eight or more surface emitting lasers 42. The array device does not necessarily need to be a one-dimensional array device, such as a 1×1, 1×2, 1×4, 1×8, or 2×1 array device, and may be a two-dimensional array device, such as a 2×2 array device.

The two n-type pads 47 and 48 in the surface emitting laser 42 are disposed opposite each other, with the mesa 44 therebetween. For example, in the 1×2 array device 66 where two surface emitting lasers 42 are arranged in the X-axis direction, the pads 47 and 46 are alternately arranged. The pads 47 and 46 arranged in the X-axis direction are used to input an electric signal. In the 2×1 array device 68 where two surface emitting lasers 42 are arranged in the Y-axis direction, the pads 46 and 48 are alternately arranged. The pads 46 and 48 arranged in the Y-axis direction are used to input an electric signal. The pads may be appropriately used depending on the arrangement of the surface emitting lasers in the array device.

The surface emitting laser 42 includes, for example, a compound semiconductor layer. The compound semiconductor layer is epitaxially grown by, for example, MOCVD and molecular beam epitaxy (MBE). In the process of epitaxial growth, directional defects may occur in the compound semiconductor layer. Non-directional random defects may also occur. In the present embodiment, where the dicing lines 50 are defined after forming and inspecting the surface emitting lasers 42, array devices free from defectives are produced.

The surface emitting lasers 42 emit light in a direction orthogonal to the wafer 40 (or in the Z-axis direction). Before dicing the wafer 40, the surface emitting lasers 42 can be operated and inspected to identify defectives and non-defectives. The wafer 40 may have, for example, light receiving elements formed thereon, so that array devices each including light receiving elements are produced by dicing. The light receiving elements each receive light in the XY plane and output an electric signal. Inspection can be performed by allowing entry of light before dicing the wafer 40.

It is preferable that the dicing lines 50 be defined after inspection is performed with respect to a plurality of items. The surface emitting laser 42 is deemed to be defective if it fails in any one of the items. An array device is thus produced, which is entirely composed of one or more surface emitting lasers 42a determined to be non-defective in all the items. The inspection items include at least one of, for example, an electrical characteristic, an optical characteristic, and an appearance. The inspection items may include all of the above, or may include additional items.

As illustrated in FIG. 4A to FIG. 5, the dicing lines 50 extend in the X-axis direction and the Y-axis direction to divide the wafer 40 into sections of more complex shapes than in the comparative example. The dicing machine 26 preferably performs laser dicing which allows formation of more complex shapes than dicing with a blade. For example, a blade is used to cut the wafer 40 in one direction, whereas laser dicing is performed to cut the wafer 40 in the X-axis direction and the Y-axis direction. Array devices of various types are formed by cutting the wafer 40 along the dicing lines 50.

While embodiments of the present disclosure have been described in detail, the present disclosure is not limited to specific embodiments. Various modifications and changes may be made within the scope of the present disclosure set forth in the appended claims.

What is claimed is:

1. An array device manufacturing method comprising the steps of:

forming a plurality of optical elements on a wafer;

inspecting the plurality of optical elements;
defining dicing lines on the basis of a result of the inspection such that an array device composed entirely of one or more non-defective ones of the plurality of optical elements is obtained, the one or more non-defective ones being determined to be non-defective in the inspection; and
forming the array device by dicing the wafer along the dicing lines, and
wherein the step of defining dicing lines is a step of defining the dicing lines such that assigning a first array device including more optical elements to a section of the wafer is prioritized over assigning a second array device including less optical elements to a section of the wafer.

2. The array device manufacturing method according to claim 1, wherein the step of forming the array device is a step of forming a plurality of array devices of different sizes.

3. The array device manufacturing method according to claim 1, wherein the first array device includes four or more optical elements.

4. The array device manufacturing method according to claim 1, wherein the step of forming a plurality of optical elements is a step of forming a plurality of surface emitting lasers or light receiving elements made of a compound semiconductor.

5. The array device manufacturing method according to claim 1, wherein the step of inspecting is a step of inspecting with respect to a plurality of items; and
the step of defining dicing lines is a step of defining the dicing lines such that the array device is composed entirely of one or more non-defective ones of the plurality of optical elements, the one or more non-defective ones being determined to be non-defective in all the plurality of items.

6. The array device manufacturing method according to claim 1, wherein the step of inspecting is a step of checking at least one of an appearance, an electrical characteristic, and an optical characteristic of the optical elements.

7. The array device manufacturing method according to claim 1, wherein the step of forming the array device includes a step of dicing the wafer with laser.

8. An array device manufacturing apparatus comprising:
an inspection unit configured to inspect a plurality of optical elements formed on a wafer; and
a dicing machine configured to form an array device by dicing the wafer along dicing lines defined such that the array device is composed entirely of one or more non-defective ones of the plurality of optical elements, the one or more non-defective ones being determined to be non-defective in the inspection, and
wherein the dicing lines are defined such that assigning a first array device including more optical elements to a section of the wafer is prioritized over assigning a second array device including less optical elements to a section of the wafer.

9. A non-transitory computer-readable storage medium storing a program for manufacturing an array device, the program causing a computer to execute the processes of:
inspecting a plurality of optical elements formed on a wafer;
defining dicing lines on the basis of a result of the inspection such that an array device composed entirely of one or more non-defective ones of the plurality of optical elements is obtained, the one or more non-defective ones being determined to be non-defective in the inspection; and
forming the array device by dicing the wafer along the dicing lines, and
wherein defining the dicing lines is a step of defining the dicing lines such that assigning a first array device including more optical elements to a section of the wafer is prioritized over assigning a second array device including less optical elements to a section of the wafer.

* * * * *